(12) United States Patent
Yamamoto et al.

(10) Patent No.: US 8,130,324 B2
(45) Date of Patent: Mar. 6, 2012

(54) AUTOMATIC GAIN CONTROL CIRCUIT

(75) Inventors: Masaki Yamamoto, Fukushima-Ken (JP); Shinichi Yamamoto, Fukushima-Ken (JP)

(73) Assignee: Alps Electronic Co., Ltd., Tokyo (JP)

( * ) Notice: Subject to any disclaimer, the term of this patent is extended or adjusted under 35 U.S.C. 154(b) by 521 days.

(21) Appl. No.: 12/477,478

(22) Filed: Jun. 3, 2009

(65) Prior Publication Data
US 2009/0310026 A1 Dec. 17, 2009

(30) Foreign Application Priority Data
Jun. 17, 2008 (JP) ................. 2008-157676

(51) Int. Cl.
H04N 5/14 (2006.01)
H04N 9/64 (2006.01)
H04N 5/52 (2006.01)
(52) U.S. Cl. .............. 348/678; 348/571; 348/679
(58) Field of Classification Search ............. 348/678
See application file for complete search history.

(56) References Cited

U.S. PATENT DOCUMENTS

| | | | |
|---|---|---|---|
| 6,348,955 B1 | 2/2002 | Tait | |
| 6,512,554 B1 * | 1/2003 | Ogasawara | 348/678 |
| 2003/0128303 A1 * | 7/2003 | Masuda | 348/731 |
| 2004/0012445 A1 | 1/2004 | Numanami et al. | |

FOREIGN PATENT DOCUMENTS

| | | |
|---|---|---|
| EP | 0 961 492 A2 | 12/1999 |
| EP | 1 126 598 A2 | 8/2001 |
| JP | 2001-298679 | 10/2001 |
| JP | 2003-189202 | 7/2003 |
| JP | 2006-60361 | 3/2006 |

OTHER PUBLICATIONS

Extended European Search Report issued in corresponding European Patent Application No. 09007842.9, issued Sep. 9, 2010.

* cited by examiner

*Primary Examiner* — Justin Shepard
(74) *Attorney, Agent, or Firm* — Brinks Hofer Gilson & Lione

(57) ABSTRACT

An AGC circuit is provided which includes a first AGC detector circuit that switches whether the AGC voltage is output or not, a second AGC detector circuit that always outputs the AGC voltage, a first resistor with a high impedance compared to a tuned frequency of which one end is connected to an output port of the first AGC detector circuit and the other end is connected to an output port of the second AGC detector circuit, and a switching element that is provided between the other end of the first resistor and a ground, in which an output source that outputs the AGC voltage to the amplifier can be switched to the first AGC detector circuit or the second AGC detector circuit by an On/Off operation of the switching element.

8 Claims, 7 Drawing Sheets

FIG. 2

| SETTING OF FIRST AGC DETECTOR CIRCUIT | | | |
|---|---|---|---|
| AGST2 | AGST1 | AGST0 | RF AGC START |
| 0 | 0 | 0 | LOOP OPEN |
| 0 | 0 | 1 | -7 dBm |
| 0 | 1 | 0 | -5 dBm |
| 0 | 1 | 1 | -3 dBm |
| 1 | 0 | 0 | -1 dBm |
| 1 | 0 | 1 | +1 dBm |
| 1 | 1 | 0 | +3 dBm |
| 1 | 1 | 1 | +5 dBm |

AUTOMATIC GAIN CONTROL CIRCUIT

CROSS REFERENCE TO RELATED APPLICATIONS

The present invention contains subject matter related to and claims priority to JapanesePatent Application No. 2008-157676 filed in the Japanese Patent Office on Jun. 17, 2008, the entire contents of which is incorporated herein by reference.

BACKGROUND

1. Technical Field

The present invention relates to an AGC (Automatic Gain Control) circuit built in a television tuner that can receive a digital television signal and an analog television signal.

2. Related Art

A television tuner is known having an AGC circuit that includes an AGC detector circuit for receiving a digital television signal and an AGC detector circuit for receiving an analog television signal and controls a gain of an AGC amplifier circuit. For example, a television tuner 41 shown in FIG. 6 includes an antenna filter 42, an antenna tuning circuit 43, an AGC amplifier circuit 44, a double-tuned circuit 45, and a mixer circuit 46. The AGC amplifier circuit 44 controls a gain so that an output becomes constant in accordance with an input signal level. The television tuner 41 further includes an IF tuning circuit 47 and IF amplifier circuits 48 and 49 that are connected to a rear stage of the mixer circuit 46 in this order. Moreover, the television tuner 41 includes a digital SAW filter 51, a GC amplifier circuit 52, a digital demodulation circuit 53, and an IF AGC circuit 54 that are connected to the rear stage of IF amplifier circuit 49 at a digital receiving side, and includes an analog SAW filter 55 and an analog demodulation circuit 56 that are connected to the IF amplifier circuit 49 at an analog receiving side.

Moreover, the IF amplifier circuit 48 is connected to an AGC detector circuit 58 for receiving a digital television signal to acquire an amplified intermediate frequency signal, and the analog demodulation circuit 56 is connected to an AGC detector circuit 59 for receiving an analog television signal to acquire a demodulated analog signal. The AGC detector circuit 58 for receiving a digital television signal or the AGC detector circuit 59 for receiving an analog television signal applies an AGC voltage to the AGC amplifier circuit 44.

The AGC detector circuit 58 for receiving a digital television signal generates an AGC voltage on the basis of the intermediate frequency signal output from the IF tuning circuit 47, and the AGC detector circuit 59 for receiving an analog television signal generates an AGC voltage on the basis of the demodulated analog signal output from the analog demodulation circuit 56. Each of the AGC detector circuits 58 and 59 is selectively connected to the AGC amplifier circuit 44 via a switching unit 61, and controls the gain of the AGC amplifier circuit 44.

FIG. 7 is a specific configuration diagram of the switching unit 61 and a control circuit thereof.

As shown in FIG. 7, an input port 61a of the switching unit 61 is connected to an AGC signal applying line L3 of the AGC detector circuit 58 for receiving a digital television signal, and an input port 61b of the switching unit 61 is connected to an AGC signal applying line L4 of the AGC detector circuit 59 for receiving an analog television signal. A time constant of the digital-reception AGC signal applying line L3 is set by a capacitor C5 and a resistor R6, and a time constant of the analog-reception AGC signal applying line L4 is set by capacitors C4 and C6 and a resistor R7. An output port 61c of the switching unit 61 is connected to the AGC amplifier circuit 44.

Moreover, the switching unit 61 is connected to a transistor 62, and the switching unit 61 performs a switching operation in accordance with a control of the transistor 62. The switching unit 61 is disconnected from the analog-reception AGC signal applying line L4 when receiving a digital television signal, and is disconnected from the digital-reception AGC signal applying line L3 when receiving an analog television signal. In this manner, because the digital-reception AGC signal applying line L3 and the analog-reception AGC signal applying line L4 have largely different time constants, the switching unit 61 is completely disconnected from one of the AGC signal applying lines to solve a problem due to the disproportionate time constants of the AGC signal applying lines.

See Japanese Unexamined Patent Application Publication No. 2003-189202 [Patent Document 1]

However, because the above-described AGC circuit 57 includes the switching unit 61 and the transistor 62 in order to disconnect the digital-reception AGC signal applying line L3 and the analog-reception AGC signal applying line L4, there is a problem that the circuit scale becomes large and the circuit configuration becomes complicated.

SUMMARY

Disclosed is an AGC circuit that controls a gain of an amplifier by an AGC voltage according to an input signal level. The AGC circuit includes a first AGC voltage generating circuit that switches whether the AGC voltage is output or not, a second AGC voltage generating circuit that always outputs the AGC voltage, a first resistor with a high impedance of which one end is connected to an output port of the first AGC voltage generating circuit and the other end is connected to an output port of the second AGC voltage generating circuit, and a switching element that is provided between the other end of the first resistor and a ground, in which an output source that outputs the AGC voltage to the amplifier is switched to the first AGC voltage generating circuit or the second AGC voltage generating circuit by an On/Off operation of the switching element.

BRIEF DESCRIPTION OF THE DRAWINGS

FIG. 2 shows the embodiment of the AGC circuit according to the invention, and is an example of control bits of a first AGC detector circuit.

FIG. 5 shows a modified example of the AGC circuit according to the invention.

DESCRIPTION OF EXEMPLARY EMBODIMENTS

Figure 1:
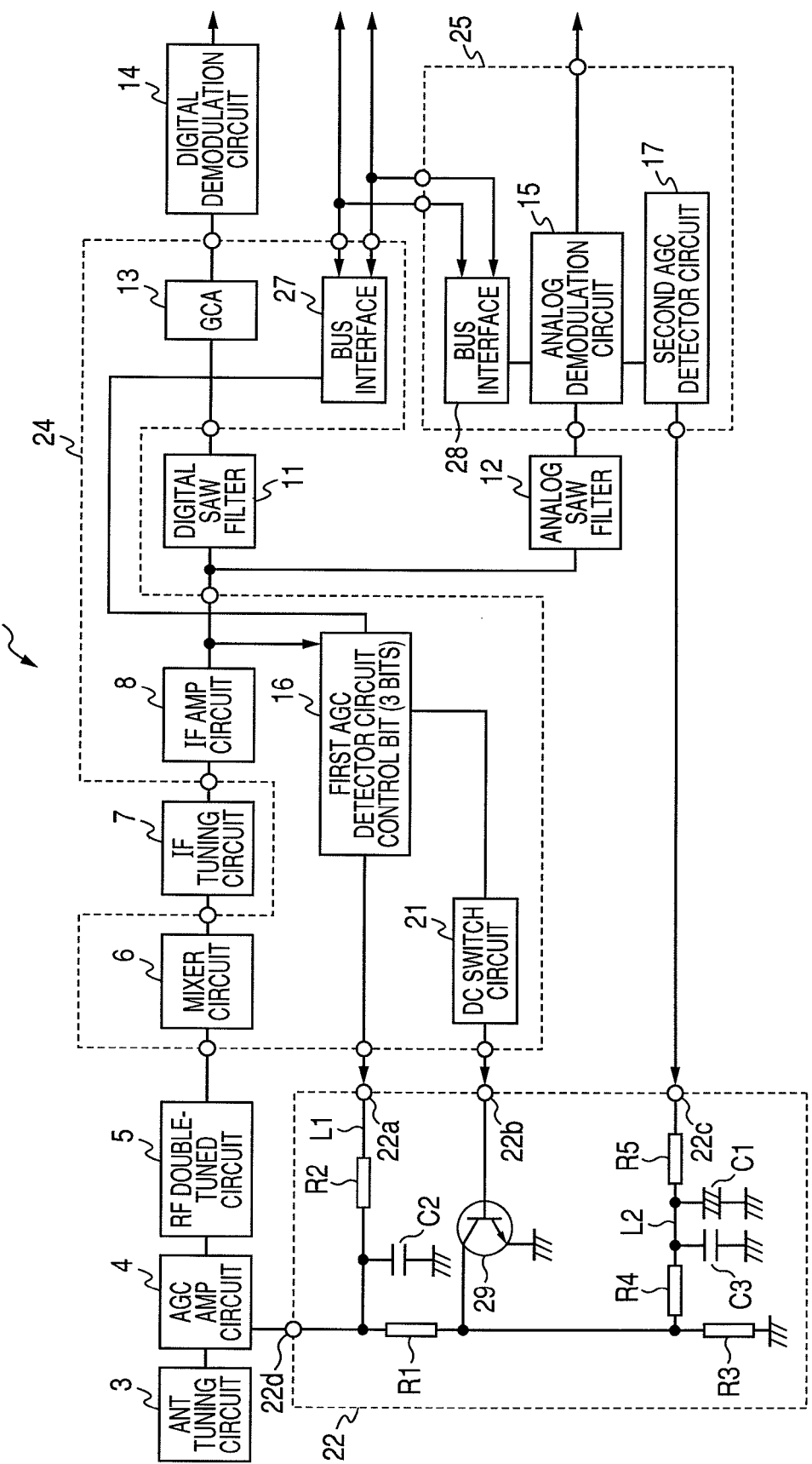
FIG. 1 shows an embodiment of an AGC circuit according to the invention, and is a block diagram of a television tuner.

Hereinafter, embodiments of the invention will be described in detail with reference to the accompanying drawings FIG. 1 is a block diagram of a television tuner according to an embodiment of the invention.

As shown in FIG. 1, a television tuner 1, includes a receiving circuit comprising a plurality of electronic components, and demodulates digital television signals and analog television signals received by an antenna element (not shown) via the plurality of electronic components.

An antenna tuning circuit 3 extracts a tuned frequency component from high frequency signals received by the antenna element, and an AGC amplifier circuit 4 controls the output of the antenna tuning circuit 3 to be constant. A mixer circuit 6 receives a high frequency signal of the frequency component passing through the AGC amplifier circuit 4 via a double-tuned circuit 5, and converts the received high frequency signal into an intermediate frequency signal. An IF tuning circuit 7 then extracts an IF component from the intermediate frequency signal converted by the mixer circuit 6, and an IF amplifier circuit 8 amplifies the IF component.

A digital SAW filter 11 and an analog SAW filter 12 respectively receive an intermediate frequency signal of the IF component amplified by the IF amplifier circuit 8, and extract a digital television signal and an analog television signal from the intermediate frequency signal. A digital demodulation circuit 14 receives the digital television signal passing through the digital SAW filter 11 via a gain control amplifier circuit 13, and demodulates the received signal. On the other hand, an analog demodulation circuit 15 demodulates the analog television signal passing through the analog SAW filter 12.

Moreover, a first AGC detector circuit 16 (a first AGC voltage generating circuit) for receiving digital television signals acquires the intermediate frequency signal amplified by the IF amplifier circuit 8. Then, the first AGC detector circuit 16 generates an AGC voltage for controlling the gain of the AGC amplifier circuit 4 in accordance with the signal level of the acquired intermediate frequency signal. Furthermore, a second AGC detector circuit 17 (a second AGC voltage generating circuit) for receiving analog television signals acquires the demodulated analog signal demodulated by the analog demodulation circuit 15. Then, the second AGC detector circuit 17 generates an AGC voltage for controlling the gain of the AGC amplifier circuit 4 in accordance with the signal level of the acquired demodulated analog signal.

The first AGC detector circuit 16 sets using control bits the AGC voltage according to the signal levels of a control signal output from a host unit (not shown) and the intermediate frequency signal passing through the IF amplifier circuit 8. The control bits are three bits, and as shown in FIG. 2, the size of the AGC voltage can be adjusted every 2 dBm between −7 dBm and +5 dBm. Moreover, when all the control bits are set to zero, the first AGC detector circuit 16 is not connected to a switching circuit 22 so as not to output the AGC voltage. In this manner, the first AGC detector circuit 16 performs not only a feedback control for the size of the AGC voltage, but also forms an open-loop path when the AGC voltage is not output.

The second AGC detector circuit 17 always outputs the AGC voltage on the basis of the demodulated analog signal demodulated by the analog demodulation circuit 15.

Moreover, the first AGC detector circuit 16 is connected to a DC switch circuit 21, and the DC switch circuit 21 outputs a switching signal for switching AGC signal applying lines L1 and L2 that apply the AGC voltage to the AGC amplifier circuit 4 to the switching circuit 22. In the case of a state other than an open-loop state that the first AGC detector circuit 16 sets all the control bits to zero, the DC switch circuit 21 outputs a switching signal (high-level signal) for selecting the first AGC detector circuit 16 to the switching circuit 22. On the other hand, in the case of the open-loop state that the first AGC detector circuit 16 sets all the control bits to zero, the DC switch circuit 21 outputs a switching signal (low-level signal) for selecting the second AGC detector circuit 17 to the switching circuit 22. In addition, details of the switching circuit 22 will be described below.

According to the present embodiment, an integrated circuit 24 (MOP-IC) includes the mixer circuit 6, the IF amplifier circuit 8, the gain control amplifier circuit 13, a bus interface 27, the first AGC detector circuit 16, and the DC switch circuit 21. The integrated circuit 24 is connected to the host unit via the bus interface 27. Moreover, an integrated analog demodulation circuit 25 (analog VIF-IC) includes the analog demodulation circuit 15, a bus interface 28, and the second AGC detector circuit 17. The integrated analog demodulation circuit 25 is connected to the host unit via the bus interface 28. Moreover, an AGC circuit according to the present embodiment includes the first AGC detector circuit 16, the second AGC detector circuit 17, and the switching circuit 22.

The switching circuit 22 is connected to the integrated circuit 24 and the integrated analog demodulation circuit 25. One input port 22a of the switching circuit 22 is connected to the digital-reception AGC signal applying line L1, and another input port 22c is connected to the analog-reception AGC signal applying line L2. The input port 22a receives the AGC voltage from the first AGC detector circuit 16, an input port 22b receives the switching signal from the DC switch circuit 21, and the input port 22c receives the AGC voltage from the second AGC detector circuit 17. Moreover, an output port 22d of the switching circuit 22 is connected to the AGC amplifier circuit 4.

The digital-reception AGC signal applying line L1 includes a second resistor R2 and a first bypass capacitor C2 (a second capacitor), and the analog-reception AGC signal applying line L2 includes a first resistor R1, a third resistor R3, a fourth resistor R4, a fifth resistor R5, a smoothing capacitor C1 (a first capacitor), and a second bypass capacitor C3. The switching circuit 22 further includes a switching element 29 that selects one of the digital-reception AGC signal applying line L1 and the analog-reception AGC signal applying line L2.

One end of the second resistor R2 is connected to the input port 22a of the switching circuit 22, and the other end of the second resistor R2 is connected to the output port 22d of the switching circuit 22. Moreover, the first bypass capacitor C2 is provided between the other end of the second resistor R2 and a ground, and a time constant of the digital-reception AGC signal applying line L1 may be set by using a capacitance value of the first bypass capacitor C2 and a resistance value of the second resistor R2.

One end of the fifth resistor R5 is connected to the input port 22c of the switching circuit 22, and the other end of the fifth resistor R5 is connected to one end of the fourth resistor R4. The third resistor R3 is connected between the other end of the fourth resistor R4 and the ground, and the first resistor R1 is connected between the connecting point between the fourth resistor R4 and the third resistor R3 and the output port 22d of the switching circuit 22.

The smoothing capacitor C1 is provided between the other end of the fifth resistor R5 and the ground, and smoothes the AGC voltage output from the second AGC detector circuit 17.

Moreover, the second bypass capacitor C3 for receiving high frequency is provided in parallel to the smoothing capacitor C1 between the other end of the fifth resistor R5 and the ground. A time constant of the analog-reception AGC signal applying line L2 may be set by using a resistance value of the first resistor R1, a resistance value of the third resistor R3, a resistance value of the fourth resistor R4, a resistance value of the fifth resistor R5, a capacitance value of the smoothing capacitor C1, and a capacitance value of the second bypass capacitor C3.

In the switching element 29 that is a transistor, a collector thereof is connected between the first resistor R1 and the fourth resistor R4 of the analog-reception AGC signal applying line L2, an emitter is connected to the ground, and a base is connected to the input port 22b.

The ratio of the resistance value of the third resistor R3 to the resistance value of the fourth resistor R4 is substantially the same as the ratio of the resistance value of the first resistor R1 to the resistance value of the second resistor R2. The maximum AGC voltage after being divided by the first resistor R1 and the second resistor R2, which is input from the first AGC detector circuit 16 to the AGC amplifier circuit 4, is substantially the same as the maximum AGC voltage after being divided by the third resistor R3 and the fourth resistor R4, which is input from the second AGC detector circuit 17 to the AGC amplifier circuit 4.

Figure 3:
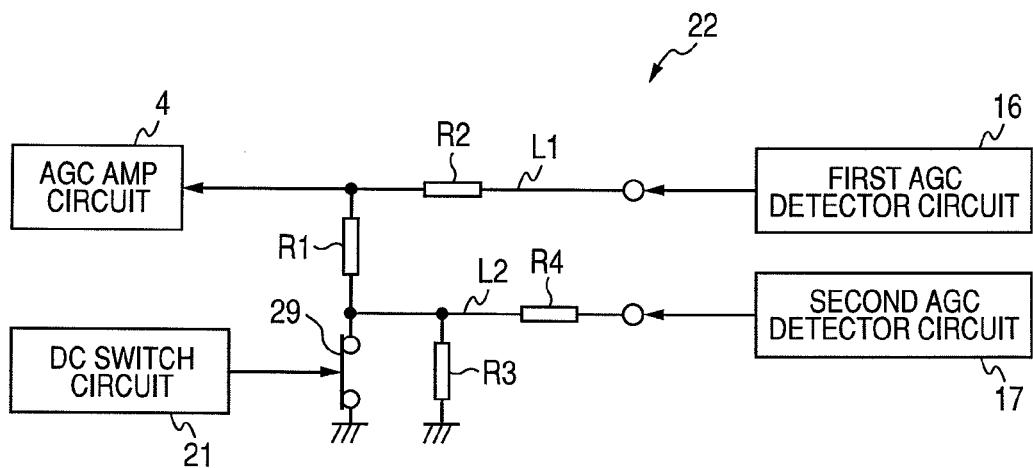
FIG. 3 shows the embodiment of the AGC circuit according to the invention, and is a diagram explaining an AGC control when digital television signals are received.

Moreover, the first resistor R1 has a high impedance, and the first resistor R1 and the switching element 29 selects one of the AGC signal applying lines L1 and L2. Hereinafter, AGC controls are described with reference to FIGS. 3 and 4. FIG. 3 is a diagram explaining an AGC control when digital television signals are received, and FIG. 4 is a diagram explaining an AGC control when analog television signals are received.

As shown in FIG. 3, when control bits according to an input electric field level are set in the first AGC detector circuit 16 from the host unit while receiving digital television signals, the first AGC detector circuit 16 becomes an output state, the DC switch circuit 21 changes a level of the switching signal to output a high-level switching signal to the switching element 29 in accordance with the setting of the first AGC detector circuit 16, and the switching element 29 becomes a conductive state. Therefore, because the switching element 29 becomes a conductive state, the analog-reception AGC signal applying line L2 is disconnected from the AGC amplifier circuit 4 due to the first resistor R1 and the switching element 29.

In this case, the AGC voltage output from the first AGC detector circuit 16 is applied to the AGC amplifier circuit 4 via the second resistor R2. On the other hand, because the first resistor R1 is a high impedance element, the AGC voltage output from the second AGC detector circuit 17 drops to the ground via the fourth resistor R4 and the switching element 29. Therefore, when digital television signals are received, the AGC voltage output from the first AGC detector circuit 16 is applied to the AGC amplifier circuit 4 to control a gain.

Figure 4:
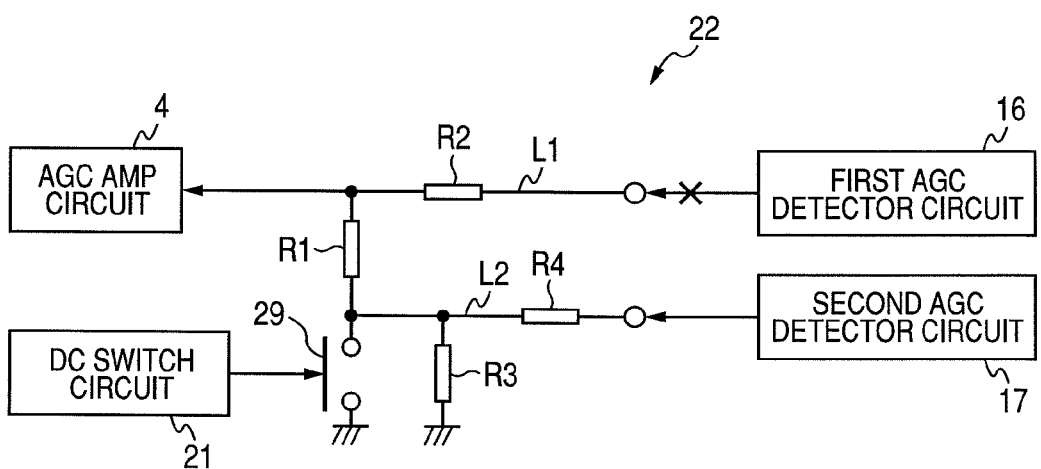
FIG. 4 shows the embodiment of the AGC circuit according to the invention, and is a diagram explaining an AGC control when analog television signals are received.

As shown in FIG. 4, when control bits according to an input electric field level are set in the first AGC detector circuit 16 from the host unit while receiving analog television signals, the first AGC detector circuit 16 becomes an non-output state (open-loop), the DC switch circuit 21 changes a level of the switching signal to output a low-level switching signal to the switching element 29 in accordance with the setting of the first AGC detector circuit 16, and the switching element 29 becomes a non-conductive state. Therefore, because the first AGC detector circuit 16 becomes the open-loop state, the digital-reception AGC signal applying line L1 is disconnected.

In this case, the first AGC detector circuit 16 does not output an AGC voltage, and the AGC voltage output from the second AGC detector circuit 17 is applied to the AGC amplifier circuit 4 via the fourth resistor R4 and the first resistor R1. Therefore, when analog television signals are received, the AGC voltage applied from the second AGC detector circuit 17 is input to the AGC amplifier circuit 4 to control a gain.

In this manner, when digital television signals are received, the switching element 29 becomes the conductive state and thus the analog-reception AGC signal applying line L2 can be electrically disconnected from the AGC amplifier circuit 4. When analog television signals are received, the digital-reception AGC signal applying line L1 becomes the open-loop state and thus can be electrically disconnected from the AGC amplifier circuit 4.

According to the AGC circuit of the present embodiment as described above, because the first AGC detector circuit 16 or the second AGC detector circuit 17 is selected in accordance with the reception of a digital television signal or an analog television signal by means of a simple circuit configuration appending the switching element 29 and the first resistor R1, the circuit scale can be reduced.

Moreover, because the AGC signal applying line that is not selected is electrically disconnected in accordance with the reception of the digital television signal or the analog television signal, a problem due to disproportionate time constants of the AGC signal applying lines can be solved by using the simple circuit configuration.

In the present embodiment, the switching circuit 22 is controlled in accordance with the setting of the control bits of the first AGC detector circuit 16. However, the switching circuit 22 may be controlled by the control of the host unit or by the control of the second AGC detector circuit 17.

Figure 5A:
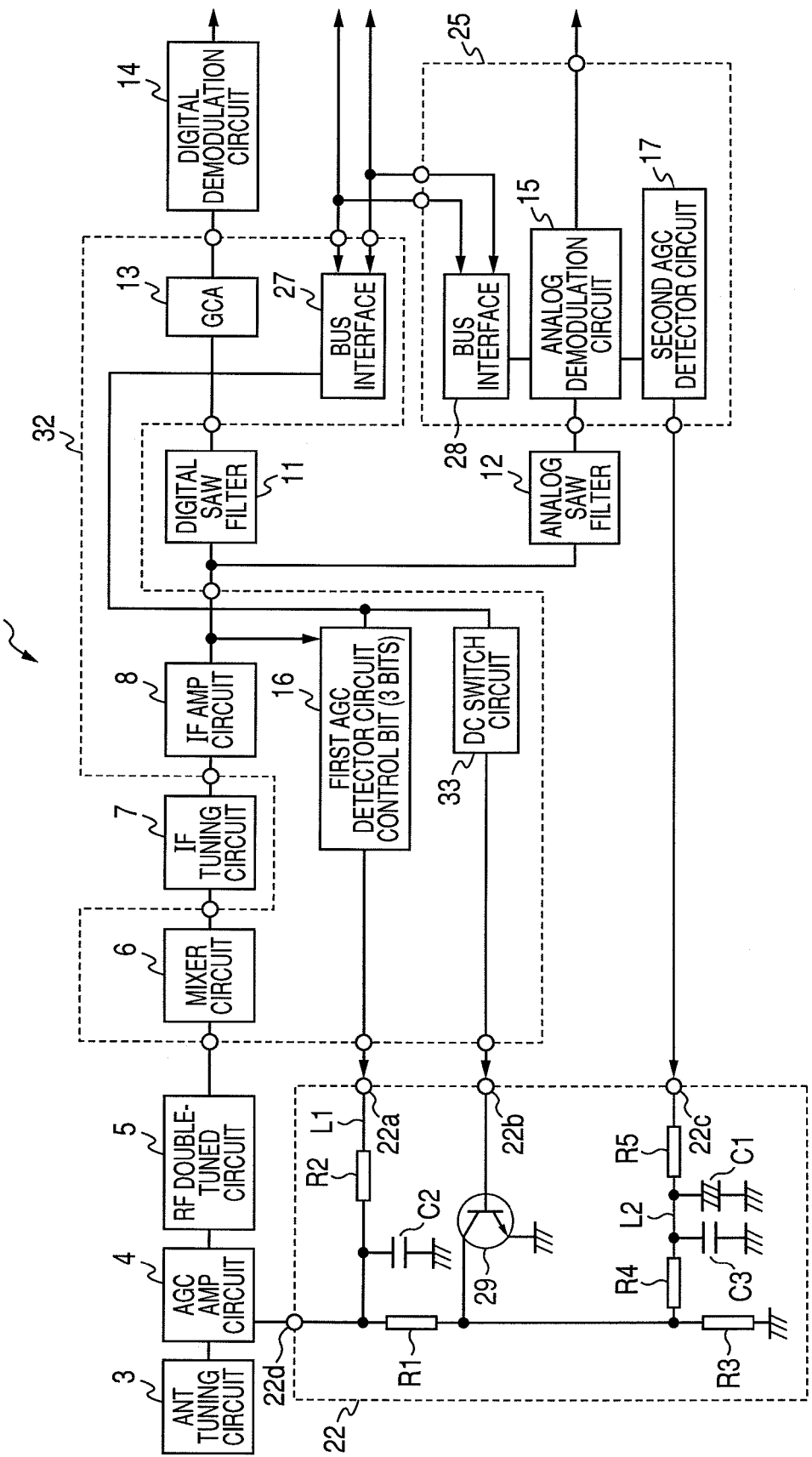
FIG. 5A is a block diagram of the television tuner when a host unit controls a switching element.
Figure 5B:
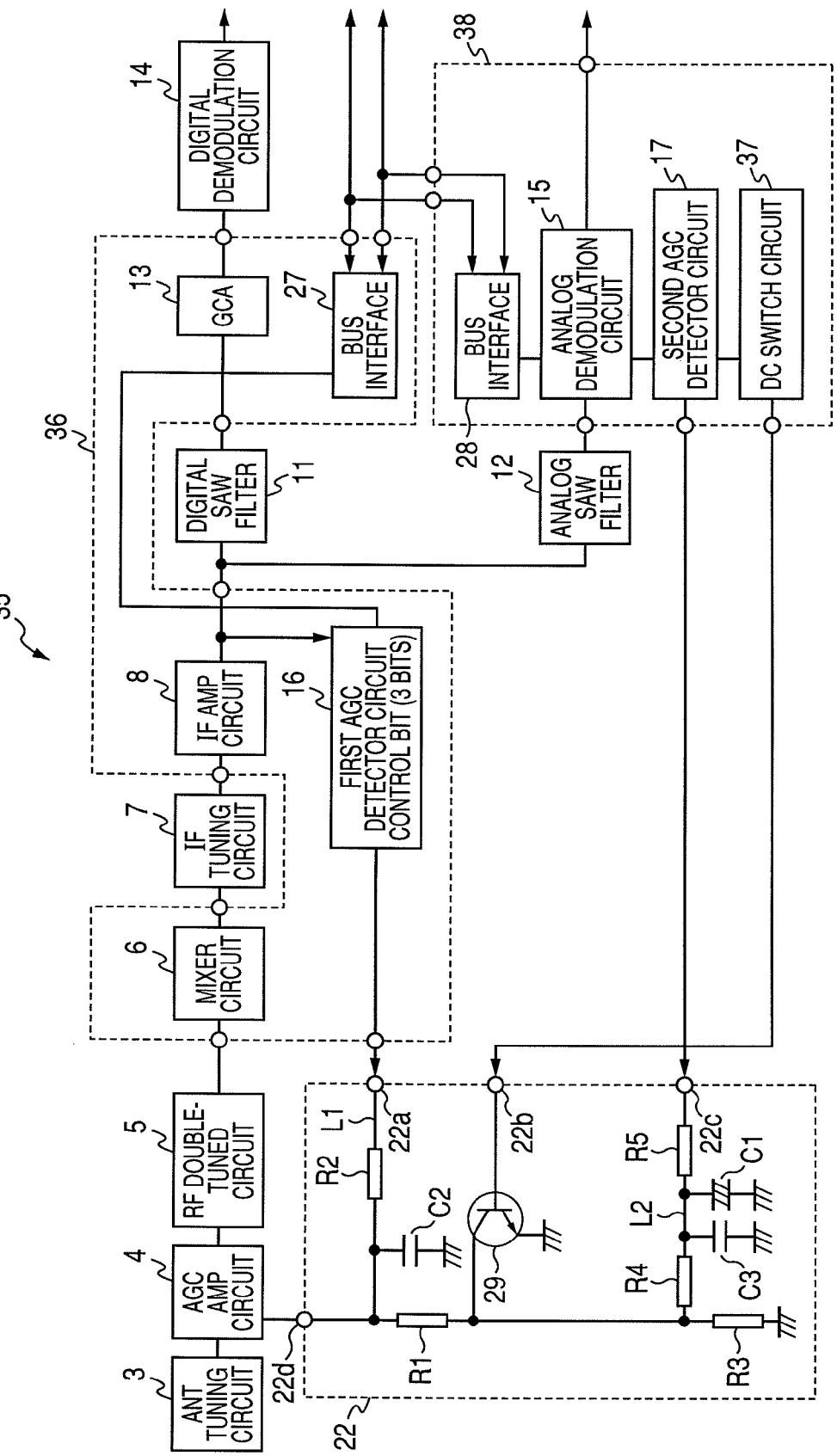
FIG. 5B is a block diagram of the television tuner when a second AGC detector circuit controls the switching element.
Figure 6:
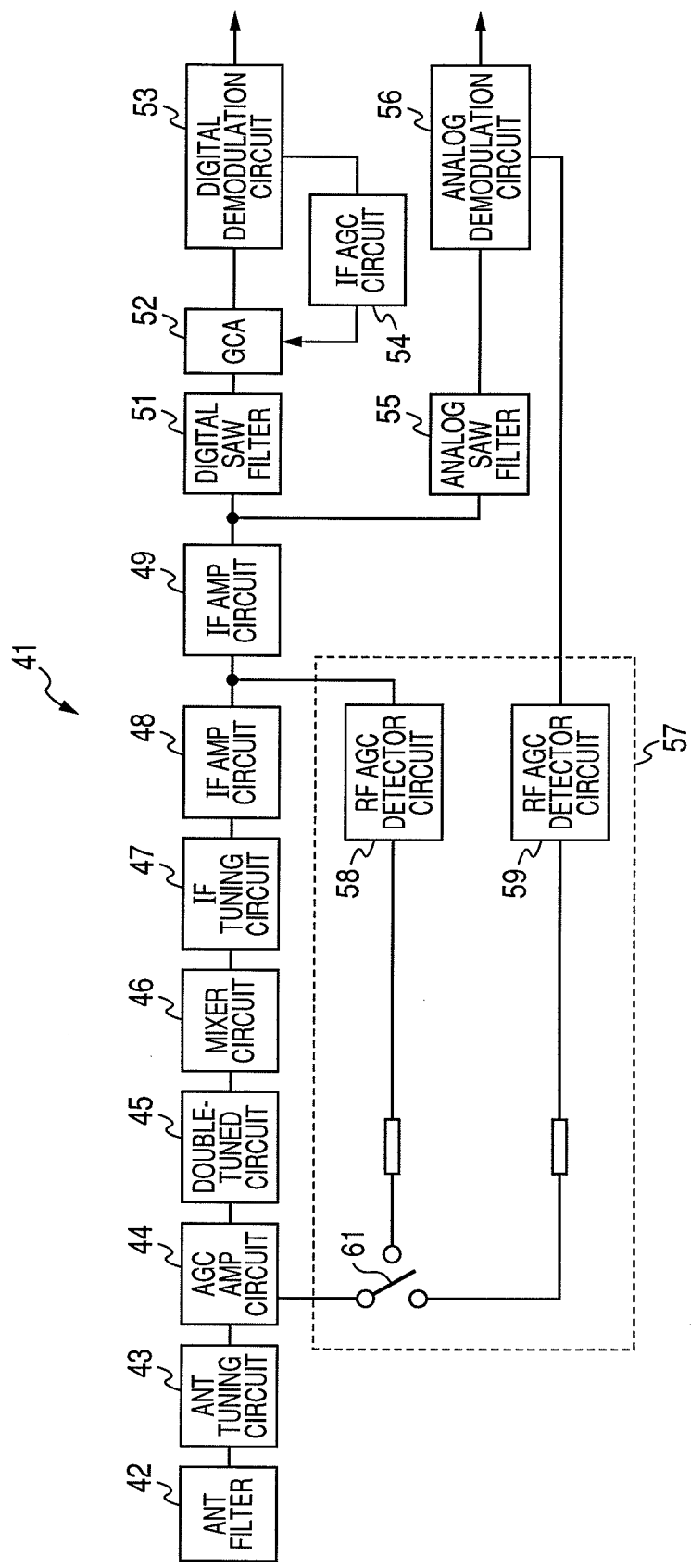
FIG. 6 shows a conventional example of the AGC circuit according to the invention.
Figure 7:
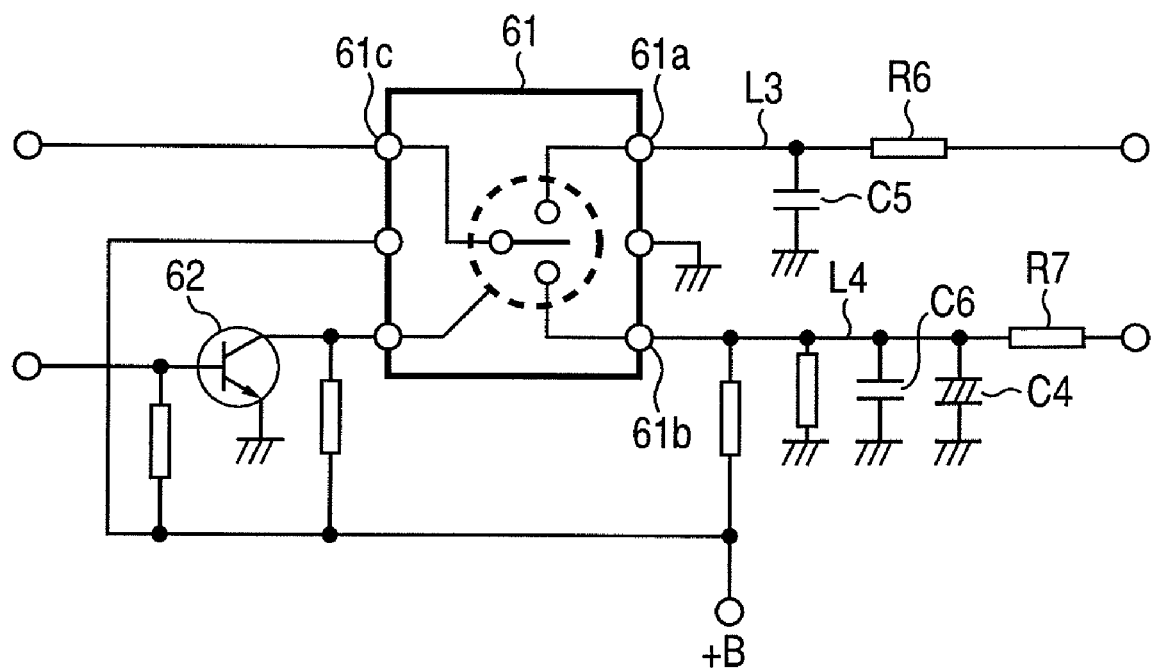
FIG. 7 shows a conventional example of the AGC circuit according to the invention.

In this case, when the host unit controls the switching circuit 22, as shown in FIG. 5A, the bus interface 27 is connected to a DC switch circuit 33, and the DC switch circuit 33 outputs a switching signal to control the switching circuit 22. Moreover, when the second AGC detector circuit 17 controls the switching circuit 22, as shown in FIG. 5B, the second AGC detector circuit 17 is connected to a DC switch circuit 37, and the DC switch circuit 37 outputs a switching signal to control the switching circuit 22.

Moreover, the present embodiments have been disclosed for purposes of illustration and thus this invention is not limited to these embodiments. The scope of the present invention is not defined by the descriptions of the above-described embodiments but is defined by claims. The scope of this invention includes the meaning equivalent to claims and all the changes within claims.

As described above, the invention can solve the problem due to the disproportionate time constants of the AGC signal applying lines by using the simple circuit configuration, has the effect that the circuit scale can be reduced, and is particularly useful for an AGC circuit built in a television tuner and so on that can receive digital television signals and analog television signals.

It should be understood by those skilled in the art that various modifications, combinations, sub-combinations and alterations may occur depending on design requirements and other factors insofar as they are within the scope of the appended claims of the equivalents thereof.

What is claimed is:

1. An AGC (Automatic Gain Control) circuit that controls a gain of an amplifier by an AGC voltage according to an input signal level, the AGC circuit comprising:
    a first AGC voltage generating circuit that switches whether the AGC voltage is output or not;
    a second AGC voltage generating circuit that always outputs the AGC voltage;
    a first resistor with a high impedance of which one end is connected to an output port of the first AGC voltage generating circuit and the other end is connected to an output port of the second AGC voltage generating circuit; and
    a switching element that is provided between the other end of the first resistor and a ground,
    wherein an output source that outputs the AGC voltage to the amplifier is switched to the first AGC voltage generating circuit or the second AGC voltage generating circuit by an On/Off operation of the switching element.

2. The AGC circuit according to claim 1,
    wherein when the AGC voltage of the first AGC voltage generating circuit is output to the amplifier, the AGC voltage of the first AGC voltage generating circuit is set to an output state and the output port of the second AGC voltage generating circuit is also connected to the ground via the switching element by turning on the switching element, and
    wherein when an AGC voltage of the second AGC voltage generating circuit is output to the amplifier, the AGC voltage of the first AGC voltage generating circuit is set to an non-output state and the AGC voltage of the second AGC voltage generating circuit is also output via the first resistor by turning off the switching element.

3. The AGC circuit according to claim 1, further comprising:
    a second resistor that is connected between the output port of the first AGC voltage generating circuit and the one end of the first resistor;
    a third resistor that is connected between the other end of the first resistor and the ground; and
    a fourth resistor that is connected between a connecting point between the first resistor and the third resistor and the output port of the second AGC voltage generating circuit.

4. The AGC circuit according to claim 3,
    wherein a ratio of the third resistor to the fourth resistor is substantially the same as a ratio of the first resistor to the second resistor.

5. The AGC circuit according to claim 1, further comprising a first capacitor that is connected between the output port of the second AGC voltage generating circuit and the ground and that smoothes the AGC voltage output from the second AGC voltage generating circuit.

6. The AGC circuit according to claim 3, further comprising a second capacitor that is connected between the one end of the first resistor and the ground,
    wherein a time constant of a first AGC signal applying line for applying the AGC voltage output from the first AGC voltage generating circuit to the amplifier is set by using a capacitance value of the second capacitor and a resistance value of the second resistor.

7. The AGC circuit according to claim 5,
    wherein a time constant of a second AGC signal applying line for applying the AGC voltage output from the second AGC voltage generating circuit to the amplifier is set by using a capacitance value of the first capacitor, a resistance value of the first resistor, a resistance value of the third resistor, and a resistance value of the fourth resistor.

8. The AGC circuit according to claim 1,
    wherein the AGC circuit is used in a digital/analog television tuner,
    wherein the first AGC voltage generating circuit generates the AGC voltage used at the time of receiving a digital television signal on the basis of an intermediate frequency signal, and
    wherein the second AGC voltage generating circuit generates the AGC voltage used at the time of receiving an analog television signal on the basis of a demodulated analog signal.

* * * * *